United States Patent
Khlat

(10) Patent No.: US 12,424,988 B2
(45) Date of Patent: Sep. 23, 2025

(54) SIGNAL PROCESSING APPARATUS AND RELATED TRANSCEIVER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 182 days.

(21) Appl. No.: 18/039,910

(22) PCT Filed: Oct. 8, 2021

(86) PCT No.: PCT/US2021/054105
§ 371 (c)(1),
(2) Date: Jun. 1, 2023

(87) PCT Pub. No.: WO2022/132295
PCT Pub. Date: Jun. 23, 2022

(65) Prior Publication Data
US 2024/0014785 A1    Jan. 11, 2024

Related U.S. Application Data

(60) Provisional application No. 63/127,476, filed on Dec. 18, 2020.

(51) Int. Cl.
*H03F 3/24* (2006.01)
*H03F 1/32* (2006.01)
*H04B 1/40* (2015.01)

(52) U.S. Cl.
CPC ........... *H03F 3/245* (2013.01); *H03F 1/3241* (2013.01); *H04B 1/40* (2013.01); *H03F 2200/451* (2013.01)

(58) Field of Classification Search
CPC .. H03F 3/245; H03F 1/3241; H03F 2200/451; H03F 2200/192;
(Continued)

(56) References Cited

U.S. PATENT DOCUMENTS 6,104,241 A * 8/2000 Cova ............... H03F 1/3223
330/149
6,720,829 B2   4/2004 Matsuyoshi et al.
(Continued)

FOREIGN PATENT DOCUMENTS

EP    1191707 A1    3/2002

OTHER PUBLICATIONS

J. M. Wetherington and M. B. Steer, "Robust Analog Canceller for High-Dynamic-Range Radio Frequency Measurement," in IEEE Transactions on Microwave Theory and Techniques, vol. 60, No. 6, pp. 1709-1719, Jun. 2012, (Year: 2012).*

(Continued)

*Primary Examiner* — Sam K Ahn
*Assistant Examiner* — Amneet Singh
(74) *Attorney, Agent, or Firm* — Withrow & Terranova, P.L.L.C.

(57) ABSTRACT

A signal processing apparatus and related transceiver circuit are disclosed. The signal processing apparatus includes a power amplifier circuit and a transceiver circuit. The transceiver circuit is configured to generate multiple composite signals each having a respective one of multiple inverted intermodulation product terms. The power amplifier circuit includes multiple power amplifiers each configured to amplify a respective one of the composite signals. By including the inverted intermodulation product terms in the composite signals prior to amplifying the composite signals, it is possible to offset intermodulation product terms inherently caused by nonlinear responses of the power amplifiers, thus helping to reduce spectrum degradation in the signal processing apparatus.

18 Claims, 5 Drawing Sheets

(58) Field of Classification Search
CPC .. H03F 2200/204; H03F 1/3252; H03F 3/211; H03F 3/195; H04B 1/40; H04B 1/0483
See application file for complete search history.

(56) References Cited

U.S. PATENT DOCUMENTS

| | | |
|---|---|---|
| 7,256,649 B2 | 8/2007 | Ksienski et al. |
| 8,761,834 B2 | 6/2014 | Luz et al. |
| 10,211,785 B2 | 2/2019 | McLaren |
| 2003/0214355 A1 | 11/2003 | Luz et al. |
| 2009/0258617 A1 | 10/2009 | Yoshihara |
| 2012/0229207 A1 | 9/2012 | Huang et al. |
| 2014/0118063 A1 | 5/2014 | Briffa et al. |
| 2016/0173031 A1 | 6/2016 | Langer |
| 2017/0005619 A1 | 1/2017 | Khlat |
| 2019/0229975 A1 | 7/2019 | Khlat et al. |
| 2020/0403661 A1 | 12/2020 | Khlat |
| 2021/0126599 A1 | 4/2021 | Khlat et al. |
| 2022/0302879 A1 | 9/2022 | Khlat |

OTHER PUBLICATIONS

Yong-Sub Lee, et al. "Linearity improvement of RF power amplifiers using a simple high-order predistorter for WCDMA applications," 2006 Asia-Pacific Microwave Conference, Yokohama, Japan, 2006, pp. 887-890 (Year: 2006).*
Non-Final Office Action for U.S. Appl. No. 16/742,976, mailed Aug. 28, 2020, 9 pages.
Non-Final Office Action for U.S. Appl. No. 16/742,976, mailed Mar. 3, 2021, 10 pages.
Final Office Action for U.S. Appl. No. 16/742,976, mailed Aug. 23, 2021, 12 pages.
Notice of Allowance for U.S. Appl. No. 16/742,976, mailed Nov. 17, 2021, 12 pages.
Notice of Allowance for U.S. Appl. No. 16/742,976, mailed Mar. 21, 2022, 13 pages.
Non-Final Office Action for U.S. Appl. No. 17/080,065, mailed Jan. 13, 2022, 5 pages.
International Search Report and Written Opinion for PCT/US2021/054105, mailed Jan. 21, 2022, 17 pages.
Written Opinion for International Patent Application No. PCT/US2021/054105, mailed Jul. 7, 2022, 11 pages.
International Preliminary Report on Patentability for International Patent Application No. PCT/US2021/054105, mailed Mar. 13, 2023, 34 pages.

* cited by examiner

SIGNAL PROCESSING APPARATUS AND RELATED TRANSCEIVER CIRCUIT

RELATED APPLICATIONS

This application is a 35 USC 371 national phase filing of International Application No. PCT/US2021/054105, filed Oct. 8, 2021, which claims the benefit of provisional patent application Ser. No. 63/127,476, filed Dec. 18, 2020, the disclosures of which are incorporated herein by reference in their entireties.

FIELD OF THE DISCLOSURE

The technology of the disclosure relates generally to a signal processing apparatus, and particularly a signal processing apparatus having a transceiver circuit that can concurrently process multiple signals.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation new radio (5G-NR) wireless communication technology has been widely regarded as the next wireless communication standard beyond the current third-generation (3G) communication standard, such as wideband code division multiple access (WCDMA), and the fourth-generation (4G) communication standard, such as Long-Term Evolution (LTE). As such, a capable mobile communication device is expected to achieve significantly higher data rates, improved coverage range, enhanced signaling efficiency, and reduced latency compared with a conventional mobile communication device supporting only the 3G and 4G communication standards.

The 5G-NR capable mobile communication device can be configured to transmit a radio frequency (RF) signal(s) in a millimeter wave (mmWave) RF spectrum that is typically above 6 GHz. Notably, RF signals transmitted in the mmWave RF spectrum are more susceptible to propagation attenuation and interference. In this regard, the 5G-NR capable mobile communication device typically employs a power amplifier circuit(s) to help improve signal-to-noise ratio (SNR) and/or signal-to-interference-plus-noise ratio (SINR) of the RF signal(s). To mitigate the propagation attenuation, the 5G-NR capable mobile communication device may be configured to explore multipath diversity by simultaneously transmitting the RF signal(s) via multiple antennas. Furthermore, by simultaneously transmitting the RF signal(s) via multiple antennas, the 5G-NR capable mobile communication device may also increase data rates through spatial multiplexing. Hence, the 5G-NR capable mobile communication device must be capable of generating, amplifying, transmitting, and receiving multiple RF signals concurrently.

SUMMARY

Embodiments of the disclosure relate to a signal processing apparatus and related transceiver circuit. The signal processing apparatus includes a power amplifier circuit and a transceiver circuit. The transceiver circuit is configured to generate multiple composite signals each having a respective one of multiple inverted intermodulation product terms. The power amplifier circuit includes multiple power amplifiers each configured to amplify a respective one of the composite signals. By including the inverted intermodulation product terms in the composite signals prior to amplifying the composite signals, it is possible to offset intermodulation product terms inherently caused by nonlinear responses of the power amplifiers, thus helping to reduce spectrum degradation in the signal processing apparatus.

In one aspect, a signal processing apparatus is provided. The signal processing apparatus includes a power amplifier circuit. The power amplifier circuit includes a first power amplifier configured to amplify a first composite signal comprising a first signal and a second signal that collectively cause a first intermodulation product term in the amplified first composite signal. The power amplifier circuit also includes a second power amplifier configured to amplify a second composite signal comprising the first signal and the second signal that collectively cause a second intermodulation product term in the amplified second composite signal. The signal processing apparatus also includes a transceiver circuit coupled to the power amplifier circuit. The transceiver circuit is configured to generate the first composite signal comprising an inverted first intermodulation product term to thereby offset the first intermodulation product term in the amplified first composite signal. The transceiver circuit is also configured to generate the second composite signal comprising an inverted second intermodulation product term to thereby offset the second intermodulation product term in the amplified second composite signal.

In another aspect, a transceiver circuit is provided. The transceiver circuit includes a first digital pre-distortion (DPD) circuit coupled to a first power amplifier configured to amplify a first composite signal comprising a first signal and a second signal that collectively cause a first intermodulation product term in the amplified first composite signal. The first DPD circuit is configured to cause an inverted first intermodulation product term to be added in the first composite signal to thereby offset the first intermodulation product term. The transceiver circuit also includes a second DPD circuit coupled to a second power amplifier configured to amplify a second composite signal comprising the first signal and the second signal that collectively cause a second intermodulation product term in the amplified second composite signal. The second DPD circuit is configured to cause an inverted second intermodulation product term to be added in the second composite signal to thereby offset the second intermodulation product term.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
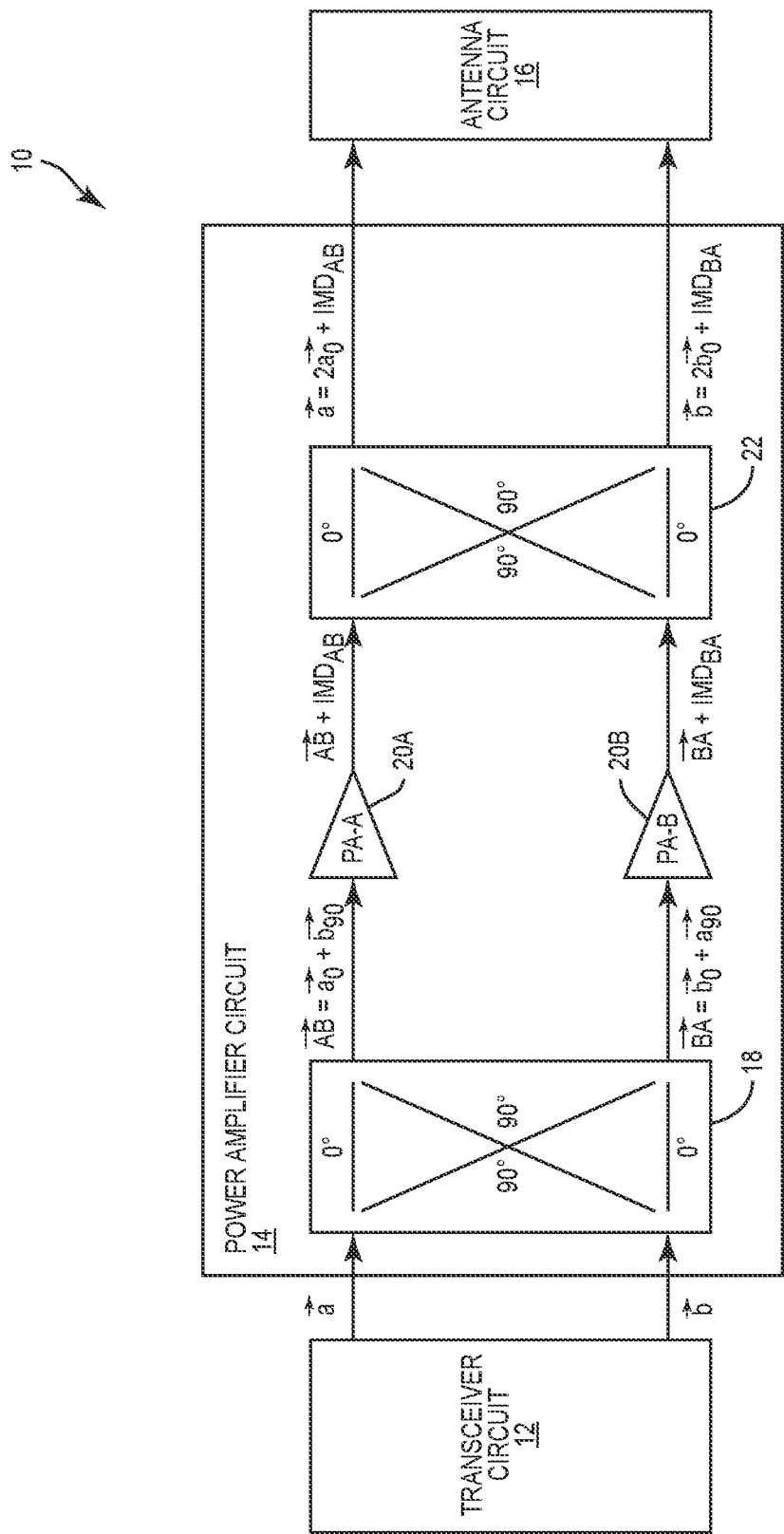
FIG. 1A is a schematic diagram of an exemplary existing signal processing apparatus that can experience spectrum degradation when amplifying a pair of radio frequency (RF) signals.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to signal processing apparatus and related transceiver circuit. The signal processing apparatus includes a power amplifier circuit and a transceiver circuit. The transceiver circuit is configured to generate multiple composite signals each having a respective one of multiple inverted intermodulation product terms. The power amplifier circuit includes multiple power amplifiers each configured to amplify a respective one of the composite signals. By including the inverted intermodulation product terms in the composite signals prior to amplifying the composite signals, it is possible to offset intermodulation product terms inherently caused by nonlinear responses of the power amplifiers, thus helping to reduce spectrum degradation in the signal processing apparatus.

Figure 1C:
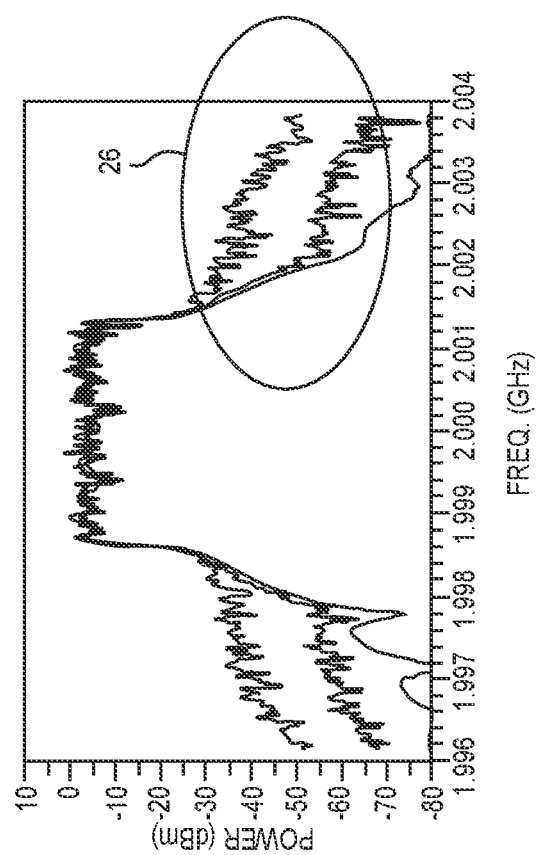
FIGS. 1B and 1C are graphic diagrams illustrating different degree of spectrum degradations experienced by signals of different power levels in the existing signal processing apparatus of FIG. 1A.
Figure 1B:
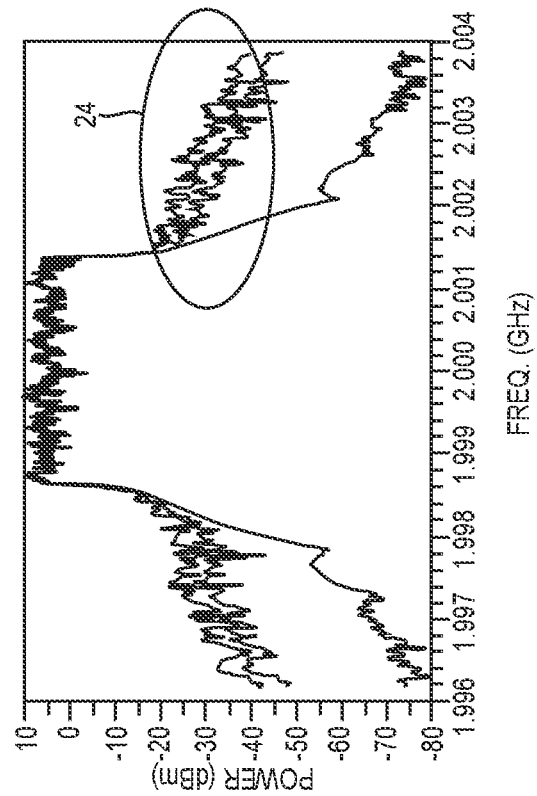
Figure 2:
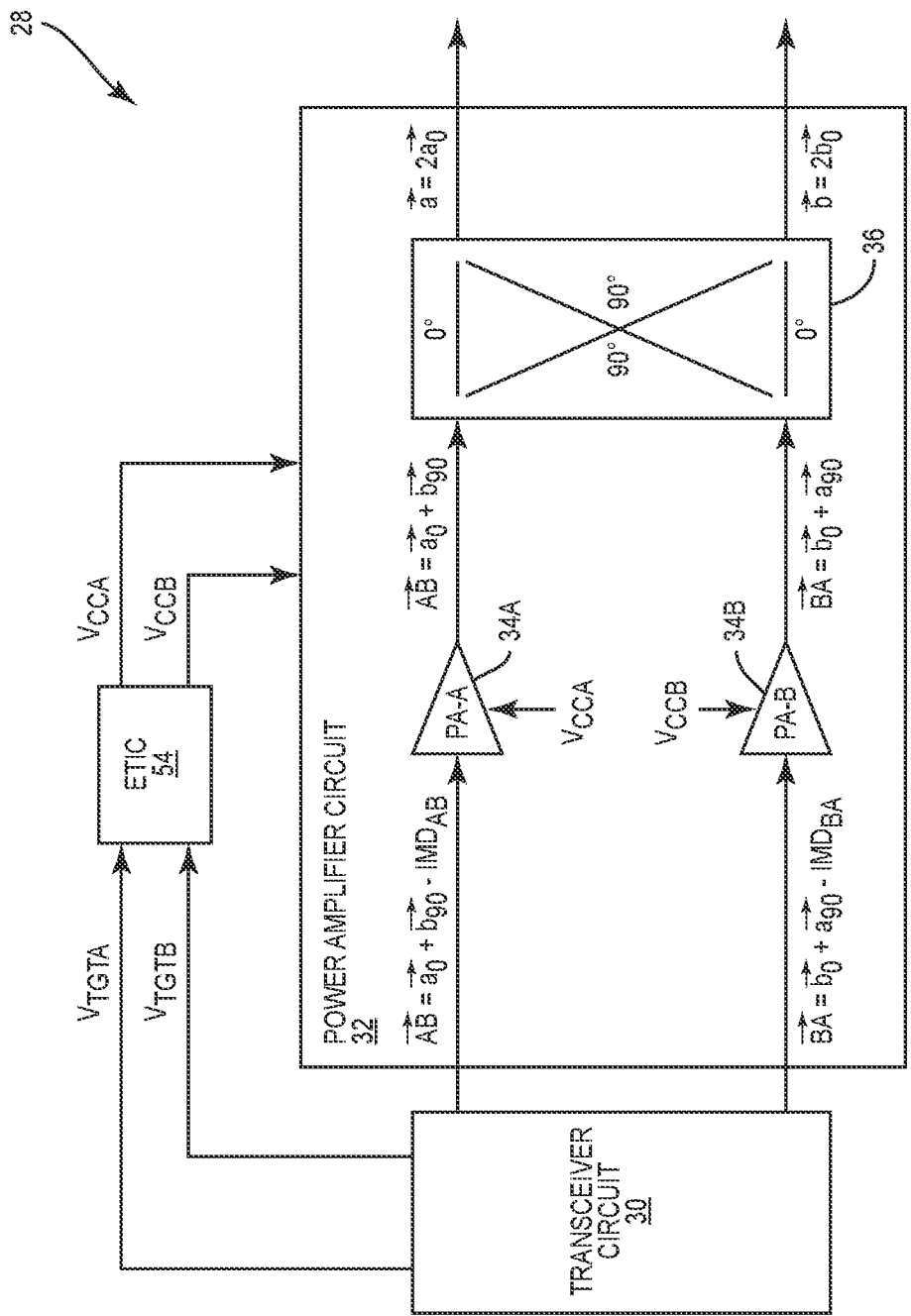
FIG. 2 is a schematic diagram of an exemplary signal processing apparatus wherein a transceiver circuit is configured according to embodiments of the present disclosure to reduce spectrum degradation in the signal processing apparatus.

Before discussing the signal processing apparatus of the present disclosure, starting at FIG. 2, an overview of an existing signal processing apparatus that can experience spectrum degradation is first provided with reference to FIGS. 1A-1C.

FIG. 1A is a schematic diagram of an exemplary existing signal processing apparatus 10 that can experience spectrum degradation when amplifying a pair of radio frequency (RF) signals $\vec{a}$ and $\vec{b}$. The existing signal processing apparatus 10 includes a transceiver circuit 12 and a power amplifier circuit 14. The transceiver circuit 12 is configured to generate the RF signals $\vec{a}$ and 6. The power amplifier circuit 14 is coupled to an antenna circuit 16 and configured to amplify the RF signals $\vec{a}$ and $\vec{b}$ before transmission via the antenna circuit 16.

The power amplifier circuit 14 includes an input hybrid circuit 18, a first power amplifier 20A, a second power amplifier 20B, and an output hybrid circuit 22. The input hybrid circuit 18 is coupled to the transceiver circuit 12 to receive the RF signals $\vec{a}$ and $\vec{b}$. The input hybrid circuit 18 is configured to generate a first composite signal $\overrightarrow{AB}$ and a second composite signal $\overrightarrow{BA}$, each including components of the RF signals $\vec{a}$ and $\vec{b}$.

Specifically, the first composite signal $\overrightarrow{AB}$ includes the RF signal $\vec{a}$ with zero-degree (0°) phase shift relative to the RF signal $\vec{a}$ and one-half (½) power of the RF signal $\vec{a}$ (denoted as $\vec{a_0}$) and the RF signal $\vec{b}$ with ninety-degree (90°) phase shift relative to the RF signal $\vec{b}$ and ½ power or the RF signal $\vec{b}$ (denoted as $\vec{b_{90}}$) ($\overrightarrow{AB}=\vec{a_0}+\vec{b_{90}}$). Similarly, the second composite signal BA includes the RF signal $\vec{b}$ with 0° phase shift relative to the RF signal $\vec{b}$ and ½ power of the RF signal $\vec{b}$ (denoted as $\vec{b_0}$) and the RF signal $\vec{a}$ with 90° phase shift relative to the RF signal $\vec{a}$ and ½ power of the RF signal $\vec{a}$ (denoted as $\vec{a_{90}}$) ($\overrightarrow{BA}=\vec{b_0}+\vec{a_{90}}$).

The first power amplifier 20A is configured to amplify the first composite signal $\overrightarrow{AB}$ and the second power amplifier 20B is configured to amplify the second composite signal $\overrightarrow{BA}$. The output hybrid circuit 22 is configured to reconstruct the RF signals $\vec{a}$ and $\vec{b}$ from the amplified first composite signal $\overrightarrow{AB}$ and the amplified second composite signal $\overrightarrow{BA}$. Specifically, the output hybrid circuit 22 first phase shifts the RF signal $\vec{a_{90}}$ in the second composite signal $\overrightarrow{BA}$ by −90° to generate another RF signal $\vec{a_0}$ which is then combined with the RF signal $\vec{a_0}$ in the first composite signal $\overrightarrow{AB}$ to reconstruct the RF signal $\vec{a}$ ($\vec{a}=2\vec{a_0}$). Similarly, the output hybrid circuit 22 first phase shifts the RF signal $\vec{b_{90}}$ in the first composite signal $\overrightarrow{AB}$ by −90° to generate another RF signal $\vec{b_0}$, which is then combined with the RF signal $\vec{b_0}$ in the second composite signal $\overrightarrow{BA}$ to reconstruct the RF signal $\vec{b}$ ($\vec{b}=2\vec{b_0}$).

Notably, the first power amplifier 20A and the second power amplifier 20B are inherently nonlinear. As such, the first power amplifier 20A and the second power amplifier 20B can cause the first composite signal $\overrightarrow{AB}$ and the second composite signal $\overrightarrow{BA}$ to each include a respective one of a first intermodulation product term $IMD_{AB}$ and a second intermodulation product term $IMD_{BA}$ after being amplified ($\overrightarrow{AB}=\overrightarrow{AB}+IMD_{AB}$ and $\overrightarrow{BA}=\overrightarrow{BA}+IMD_{BA}$). As a result, the reconstructed RF signals $\vec{a}$ and $\vec{b}$ will also include the first intermodulation product term $IMD_{AB}$ and the second intermodulation product term $IMD_{BA}$, respectively ($\vec{a}=2\vec{a_0}+IMD_{AB}$ and $\vec{b}=2\vec{b_0}+IMD_{BA}$).

The first intermodulation product term $IMD_{AB}$ and the second intermodulation product term $IMD_{BA}$ may cause spectrum degradation in the RF signals $\vec{a}$ and $\vec{b}$, especially when one of the RF signals $\alpha$ and $\vec{b}$ has a substantially higher power than another one of the RF signals $\vec{a}$ and $\vec{b}$ (e.g., $\vec{a}\gg\vec{b}$). In this regard, FIGS. 1B and 1C are graphic diagrams illustrating different degree of spectrum degradations experienced by the RF signals $\vec{a}$ and $\vec{b}$ in the existing signal processing apparatus 10 of FIG. 1A.

Specifically, FIG. 1B illustrates spectrum degradation experienced by RF signal $\vec{a}$ (e.g., as shown in oval 24) and FIG. 1C illustrates spectrum degradation experienced by RF signal $\vec{b}$ (e.g., as shown in oval 26). It is apparent from FIGS. 1B and 1C that RF signal $\vec{b}$ experienced larger spectrum degradation than RF signal $\vec{a}$ since RF signal $\vec{b}$ has substantially lower power than RF signal $\vec{a}$. Hence, it is desirable to reduce the first intermodulation product term $IMD_{AB}$ and the second intermodulation product term $IMD_{BA}$ to help reduce spectrum degradation in the existing signal processing apparatus 10.

A well-established method for suppressing intermodulation products is known as digital pre-distortion (DPD). However, it is unable to perform DPD in the power amplifier circuit 14 given that the RF signals $\vec{a}$ and $\vec{b}$, and likewise the first composite signal $\overrightarrow{AB}$ and the second composite signal $\overrightarrow{BA}$, are all analog signals. Hence, it is also desirable to perform DPD outside the power amplifier circuit 14.

In this regard, FIG. 2 is a schematic diagram of an exemplary signal processing apparatus 28 wherein a transceiver circuit 30 is configured according to embodiments of the present disclosure to perform DPD to help reduce spectrum degradation in a first signal a and/or a second signal 6. The signal processing apparatus 28 also includes a power amplifier circuit 32, which is separated from the transceiver circuit 30 (e.g., in a different die).

The power amplifier circuit 32 includes a first power amplifier 34A and a second power amplifier 34B, which are functionally equivalent to the first power amplifier 20A and the second power amplifier 20B in FIG. 1A. Like the first power amplifier 20A and the second power amplifier 20B, the first power amplifier 34A is configured to amplify a first composite signal $\overrightarrow{AB}$ ($\overrightarrow{AB}=\vec{a_0}+\vec{b_{90}}$) and the second power amplifier 34B is configured to amplify a second composite signal $\overrightarrow{BA}$ ($\overrightarrow{BA}=\vec{b_0}+\vec{a_{90}}$).

The power amplifier circuit 32 also includes an analog hybrid circuit 36, which is functionally equivalent to the output hybrid circuit 22 in FIG. 1A. Like the output hybrid circuit 22, the analog hybrid circuit 36 is configured to reconstruct the first signal $\vec{a}$ and the second signal $\vec{b}$ from the amplified first composite signal $\overrightarrow{AB}$ and the amplified second composite signal $\overrightarrow{BA}$. Given that the first power amplifier 34A and the second power amplifier 34B can also cause the first intermodulation product term $IMD_{AB}$ and the second intermodulation product term $IMD_{BA}$ in the amplified first composite signal $\overrightarrow{AB}$ and the amplified second composite signal $\overrightarrow{BA}$, the reconstructed first signal a and second signal $\vec{b}$ can also experience spectrum degradation, particularly when one of the first signal $\vec{a}$ and the second signal $\vec{b}$ has significantly higher power (e.g., ≥10 dBm) than another one of the first signal $\vec{a}$ and the second signal $\vec{b}$.

As discussed in detail below, the transceiver circuit 30 is configured to perform DPD in digital domain to add an inverted first intermodulation product term $-IMD_{AB}$ and an inverted second intermodulation product term $-IMD_{BA}$ into the first composite signal $\overrightarrow{AB}$ and the second composite signal $\overrightarrow{BA}$, respectively. Thus, when the first power amplifier 34A and the second power amplifier 34B amplify the first composite signal $\overrightarrow{AB}$ and the second composite signal $\overrightarrow{BA}$, the first intermodulation product term $IMD_{AB}$ and the second intermodulation product term $IMD_{BA}$ caused by the first power amplifier 34A and the second power amplifier 34B can be canceled by the inverted first intermodulation product term $-IMD_{AB}$ and the inverted second intermodulation product term $-IMD_{BA}$. As a result, it is possible to reduce spectrum degradation in the first signal $\vec{a}$ and/or the second signal $\vec{b}$.

Figure 3:
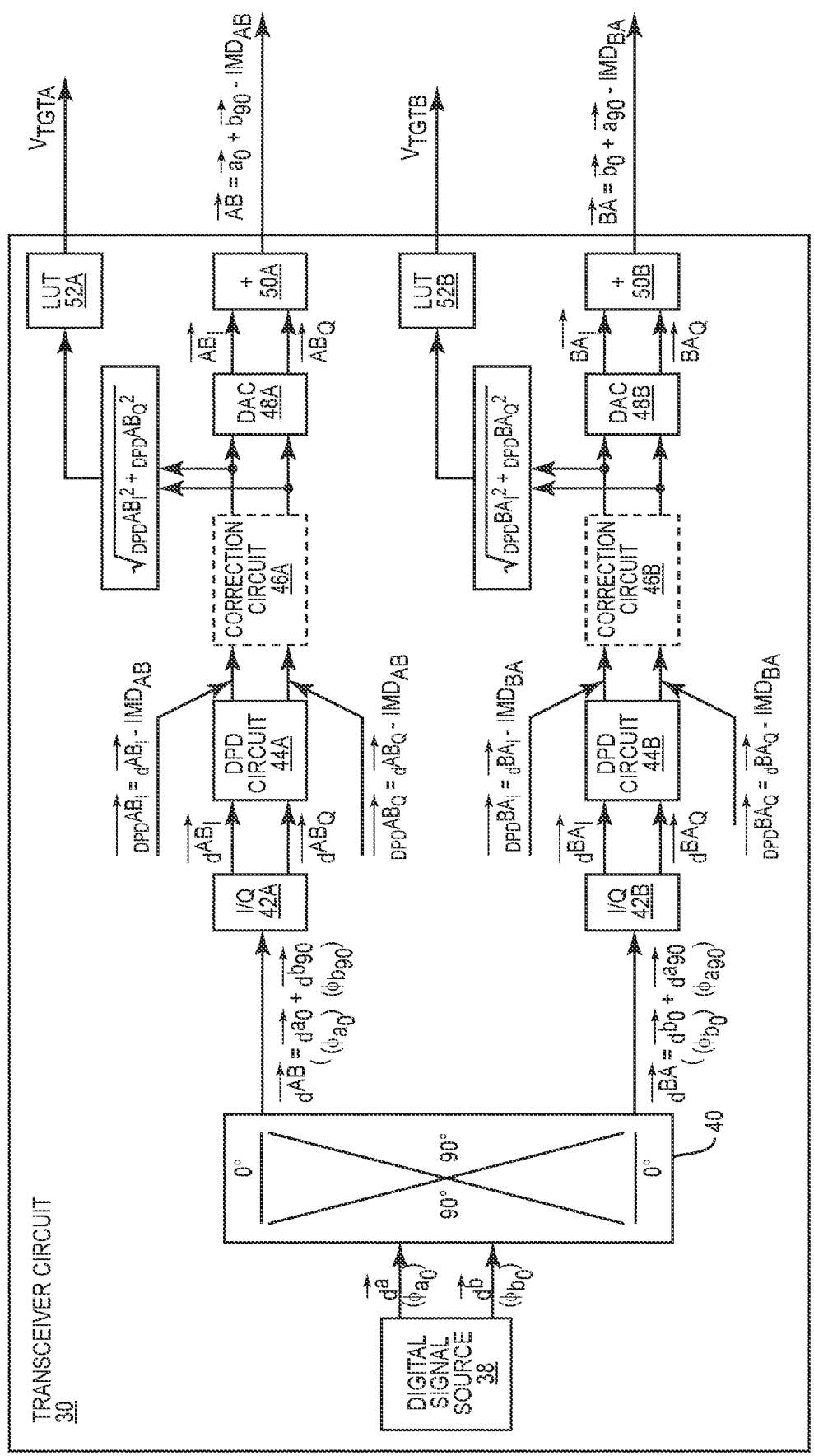
FIG. 3 is a schematic diagram providing an exemplary illustration of the transceiver circuit in FIG. 2 configured according to one embodiment of the present disclosure.

FIG. 3 is a schematic diagram providing an exemplary illustration of the transceiver circuit 30 in FIG. 2 configured according to an embodiment of the present disclosure. Common elements between FIGS. 2 and 3 are shown therein with common element numbers and will not be re-described herein.

In a non-limiting example, the transceiver circuit 30 includes a digital signal source 38 and a digital hybrid circuit 40. The digital signal source 38 is configured to generate a first digital signal $\vec{da}$ having a first phase $\phi_{a0}$ and a second digital signal $\vec{db}$ having a second phase $\phi_{b0}$.

In examples discussed herein, the first phase $\phi_{a0}$ and the second phase $\phi_{b0}$ are each assumed to be 0°. It should be appreciated that it is not essential for the first phase $\phi_{a0}$ and the second phase $\phi_{b0}$ to be 0°. For example, the first phase $\phi_{a0}$ and the second phase $\phi_{b0}$ can each be −45° as well.

The digital hybrid circuit 40 is configured to phase-shift the second digital signal $\vec{db}$ to a first orthogonal phase $\phi_{b90}$ relative to the first digital signal $\vec{da}$ ($\phi_{b90} = \phi_{a0} \pm 90°$) to thereby generate a phase-shifted second digital signal $\vec{db}_{90}$. Accordingly, the digital hybrid circuit 40 combines the first digital signal $\vec{da}$ without phase shifting (also referred to as non-phase-shifted first signal $\vec{da}_0$) and the phase-shifted second digital signal $\vec{db}_{90}$ to generate a first digital composite signal $\vec{dAB}$ ($\vec{dAB} = \vec{da}_0 + \vec{db}_{90}$). Similarly, the digital hybrid circuit 40 is configured to phase-shift the first digital signal $\vec{da}$ to a second orthogonal phase $\phi_{a90}$ relative to the second digital signal $\vec{db}$ ($\phi_{a90} = \phi_{b0} \pm 90°$) to thereby generate a phase-shifted first digital signal $\vec{da}_{90}$. Accordingly, the digital hybrid circuit 40 combines the second digital signal $\vec{db}$ without phase shifting (also referred to as non-phase-shifted second signal $\vec{db}_0$) and the phase-shifted first digital signal $\vec{da}_{90}$ to generate a second digital composite signal $\vec{dBA}$ ($\vec{dBA} = \vec{db}_0 + \vec{da}_{90}$).

The transceiver circuit 30 includes a first digital circuit 42A and a second digital circuit 42B (each denoted as "I/Q"). The first digital circuit 42A is configured to convert the first digital composite signal $\vec{dAB}$ into a first digital composite in-phase signal $\vec{dAB}_I$ and a first digital composite quadrature signal $\vec{dAB}_Q$. Understandably, each of the first digital composite in-phase signal $\vec{dAB}_I$ and the first digital composite quadrature signal $\vec{dAB}_Q$ will include the non-phase-shifted first digital signal=$\vec{da}_0$ and the phase-shifted second digital signal $\vec{db}_{90}$. Similarly, the second digital circuit 42B is configured to convert the second digital composite signal $\vec{dBA}$ into a second digital composite in-phase signal $\vec{dBA}_I$ and a second digital composite quadrature signal $\vec{dBA}_Q$. Understandably, each of the second digital composite in-phase signal $\vec{dBA}_I$ and the second digital composite quadrature signal $\vec{dBA}_Q$ will include the non-phase-shifted second digital signal=$\vec{db}_0$ and the phase-shifted first digital signal $\vec{da}_{90}$.

The transceiver circuit 30 also includes a first DPD circuit 44A and a second DPD circuit 44B. The first DPD circuit 44A is configured to add the inverted first intermodulation product term $-IMD_{AB}$ in each of the first digital composite in-phase signal $\vec{dAB}_I$ and the first digital composite quadrature signal $\vec{dAB}_Q$ to generate a pre-distorted first digital composite in-phase signal $\overrightarrow{DPDAB}_I$ ($\overrightarrow{DPDAB}_I = \vec{dAB}_I - IMD_{AB}$) and a pre-distorted first digital composite quadrature signal $\overrightarrow{DPDAB}_Q$ ($\overrightarrow{DPDAB}_Q = \vec{dAB}_Q - IMD_{AB}$). Likewise, the second DPD circuit 44B is configured to add the inverted second intermodulation product term $-IMD_{BA}$ in each of the second digital composite in-phase signal $\vec{dBA}_I$ and the second digital composite quadrature signal $\vec{dBA}_Q$ to generate a pre-distorted second digital composite in-phase signal $\overrightarrow{DPDBA}_I$ ($\overrightarrow{DPDBA}_I = \vec{dBA}_I - IMD_{BA}$) and a pre-distorted second digital composite quadrature signal $\overrightarrow{DPDBA}_Q$ ($\overrightarrow{DPDBA}_Q = \vec{dBA}_Q - IMD_{BA}$).

In one embodiment, the transceiver circuit 30 can be configured to determine whether a power difference between the first signal $\vec{a}$ and the second signal $\vec{b}$ is higher than or equal to a threshold (e.g., 10 dBm) given that the transceiver circuit 30 has the knowledge (e.g., via configuration) about respective powers of the first signal $\vec{a}$ and the second signal $\vec{b}$. Further, the transceiver circuit 30 may also have such knowledge as center frequency and bandwidth of the first signal $\vec{a}$ and the second signal $\vec{b}$, which allows the transceiver circuit 30 to estimate the first intermodulation product term $-IMD_{AB}$ and the second intermodulation product term $-IMD_{BA}$ and thereby determine the inverted first intermodulation product term $-IMD_{AB}$ and the inverted second intermodulation product term $-IMD_{BA}$. Thus, in response to the power difference being higher than or equal to the threshold, the transceiver circuit 30 can generate the first composite signal $\vec{AB}$ and the second composite signal $\vec{BA}$ that include the inverted first intermodulation product term $-IMD_{AB}$ and the inverted second intermodulation product term $-IMD_{BA}$, respectively.

In this regard, the first DPD circuit 44A will generate the pre-distorted first digital composite in-phase signal $\overrightarrow{DPDAB}_I$ and the pre-distorted first digital composite quadrature signal $\overrightarrow{DPDAB}_Q$ to each include the inverted first intermodulation product term $-IMD_{AB}$. Likewise, the second DPD circuit 44B will generate the pre-distorted second digital composite in-phase signal $\overrightarrow{DPDBA}_I$ and the pre-distorted second digital composite quadrature signal $\overrightarrow{DPDBA}_Q$ to each include the inverted second intermodulation product term $-IMD_{BA}$.

In contrast, in response to the power difference being lower than the threshold, the transceiver circuit 30 can generate first composite signal AB and the second composite signal BA without the inverted first intermodulation product term $-IMD_{AB}$ and the inverted second intermodulation product term $-IMD_{BA}$.

In this regard, the first DPD circuit 44A will generate each of the pre-distorted first digital composite in-phase signal $\overline{\overrightarrow{DPDAB_I}}$ and the pre-distorted first digital composite quadrature signal $\overline{\overrightarrow{DPDAB_Q}}$ without the inverted first intermodulation product term $-IMD_{AB}$. Likewise, the second DPD circuit 44B will generate each of the pre-distorted second digital composite in-phase signal $\overline{\overrightarrow{DPDBA_I}}$ and the pre-distorted second digital composite quadrature signal $\overline{\overrightarrow{DPDBA_Q}}$ without the inverted second intermodulation product term $-IMD_{BA}$.

In an alternative embodiment, the transceiver circuit 30 can also be configured to generate the first composite signal $\overrightarrow{AB}$ and the second composite signal BA that include the inverted first intermodulation product term $-IMD_{AB}$ and the inverted second intermodulation product term $-IMD_{BA}$, respectively, independent of a power difference between the first signal $\overrightarrow{a}$ and the second signal $\overrightarrow{b}$. In this regard, the first DPD circuit 44A will always generate the pre-distorted first digital composite in-phase signal $\overline{\overrightarrow{DPDAB_I}}$ and the pre-distorted first digital composite quadrature signal $\overline{\overrightarrow{DPDAB_Q}}$ to each include the inverted first intermodulation product term $-IMD_{AB}$. Likewise, the second DPD circuit 44B will always generate the pre-distorted second digital composite in-phase signal $\overline{\overrightarrow{DPDBA_I}}$ and the pre-distorted second digital composite quadrature signal $\overline{\overrightarrow{DPDBA_Q}}$ to each include the inverted second intermodulation product term $-IMD_{BA}$.

The transceiver circuit 30 may include a first correction circuit 46A and a second correction circuit 46B. The first correction circuit 46A may be configured to phase-shift one or more of the pre-distorted first digital composite in-phase signal $\overline{\overrightarrow{DPDAB_I}}$ and the pre-distorted first digital composite quadrature signal $\overline{\overrightarrow{DPDAB_Q}}$ to thereby ensure phase orthogonality between the pre-distorted first digital composite in-phase signal $\overline{\overrightarrow{DPDAB_I}}$ and the pre-distorted first digital composite quadrature signal $\overline{\overrightarrow{DPDAB_Q}}$. In addition, the first correction circuit 46A may also be configured to amplitude-adjust one or more of the pre-distorted first digital composite in-phase signal $\overline{\overrightarrow{DPDAB_I}}$ and the pre-distorted first digital composite quadrature signal $\overline{\overrightarrow{DPDAB_Q}}$.

Similarly, the second correction circuit 46B may be configured to phase-shift one or more of the pre-distorted second digital composite in-phase signal $\overline{\overrightarrow{DPDBA_I}}$ and the pre-distorted second digital composite quadrature signal $\overline{\overrightarrow{DPDBA_Q}}$ to thereby ensure phase orthogonality between the pre-distorted second digital composite in-phase signal $\overline{\overrightarrow{DPDBA_I}}$ and the pre-distorted second digital composite quadrature signal $\overline{\overrightarrow{DPDBA_Q}}$. In addition, the second correction circuit 46B may also be configured to amplitude-adjust one or more of the pre-distorted second digital composite in-phase signal $\overline{\overrightarrow{DPDBA_I}}$ and the pre-distorted second digital composite quadrature signal $\overline{\overrightarrow{DPDBA_Q}}$.

The transceiver circuit 30 also includes a first digital-to-analog converter (DAC) 48A and a second DAC 48B. The first DAC 48A is configured to convert the pre-distorted first digital composite in-phase signal $\overline{\overrightarrow{DPDAB_I}}$ into a first analog composite in-phase signal $\overrightarrow{AB_I}$ and covert the pre-distorted first digital composite quadrature signal $\overline{\overrightarrow{DPDAB_Q}}$ into a first analog composite quadrature signal $\overrightarrow{AB_Q}$. Notably, through the digital-to-analog conversion, the first analog composite in-phase signal $\overrightarrow{AB_I}$ and the first analog composite quadrature signal $\overrightarrow{AB_Q}$ will each include an analog version of the non-phase-shifted first signal $\overrightarrow{da_0}$ (a.k.a. $\overrightarrow{a_0}$) and an analog version of the phase-shifted second digital signal $\overrightarrow{db_{90}}$ (a.k.a. $\overrightarrow{b_{90}}$). Moreover, the first analog composite in-phase signal $\overrightarrow{AB_I}$ and the first analog composite quadrature signal $\overrightarrow{AB_Q}$ will each include the inverted first intermodulation product term $-IMD_{AB}$, if created by the first DPD circuit 44A.

Similarly, the second DAC 48B is configured to convert the pre-distorted second digital composite in-phase signal $\overline{\overrightarrow{DPDBA_I}}$ into a second analog composite in-phase signal $\overrightarrow{BA_I}$ and covert the pre-distorted second digital composite quadrature signal $\overline{\overrightarrow{DPDBA_Q}}$ into a second analog composite quadrature signal $\overrightarrow{BA_Q}$. Notably, through the digital-to-analog conversion, the second analog composite in-phase signal $\overrightarrow{BA_I}$ and the second analog composite quadrature signal $\overrightarrow{BA_Q}$ will each include an analog version of the non-phase-shifted second signal $\overrightarrow{db_0}$ (a.k.a. $\overrightarrow{b_0}$) and an analog version of the phase-shifted first digital signal $\overrightarrow{da_{90}}$ (a.k.a. $\overrightarrow{a_{90}}$). Moreover, the second analog composite in-phase signal $\overrightarrow{BA_I}$ and the second analog composite quadrature signal $\overrightarrow{BA_Q}$ will each include the inverted second intermodulation product term $-IMD_{BA}$, if created by the second DPD circuit 44B.

The transceiver circuit 30 further includes a first combiner circuit 50A and a second combiner circuit 50B. The first combiner circuit 50A is configured to combine the first analog composite in-phase signal $\overrightarrow{AB_I}$ and the first analog composite quadrature signal $\overrightarrow{AB_Q}$ to generate the first composite signal $\overrightarrow{AB}$, which will inherently include the first signal $\overrightarrow{a_0}$ and the second signal $\overrightarrow{b_{90}}$. The first composite signal $\overrightarrow{AB}$ will also include the inverted first intermodulation product term $-IMD_{AB}$, if created by the first DPD circuit 44A.

Likewise, the second combiner circuit 50B is configured to combine the second analog composite in-phase signal $\overrightarrow{BA_I}$ and the second analog composite quadrature signal $\overrightarrow{BA_Q}$ to generate the second composite signal $\overrightarrow{BA}$, which will inherently include the second signal $\overrightarrow{b_0}$ and the first signal $\overrightarrow{a_{90}}$. The second composite signal BA will also include the inverted second intermodulation product term $-IMD_{BA}$, if created by the second DPD circuit 44B.

The transceiver circuit 30 may also include a first target voltage circuit 52A and a second target voltage circuit 52B.

Notably, each of the first target voltage circuit 52A and the second target voltage circuit 52B is denoted as "LUT" to imply that a lookup table (LUT) can be included in each of the first target voltage circuit 52A and the second target voltage circuit 52B.

In an embodiment, the first target voltage circuit 52A is configured to generate a first target voltage $V_{TGTA}$ based on amplitudes of the pre-distorted first digital composite in-phase signal $\overrightarrow{DPDAB_I}$ and the pre-distorted first digital composite quadrature signal $\overrightarrow{DPDAB_Q}$ (e.g., $\sqrt{DPDAB_I^2 + _{DPD}AB_Q^2}$). Likewise, the second target voltage circuit 52B is configured to generate a second target voltage $V_{TGTB}$ based on amplitudes of the pre-distorted second digital composite in-phase signal $\overrightarrow{DPDBA_I}$ and the pre-distorted second digital composite quadrature signal $\overrightarrow{DPDBA_Q}$ (e.g., $\sqrt{DPDBA_I^2 + DPDBA_Q^2}$).

With reference back to FIG. 2, the signal processing apparatus 28 can further include an envelope tracking (ET) integrated circuit (ETIC) 54, which is separated from the transceiver circuit 30 and the power amplifier circuit 32 (e.g., in a different die). The ETIC 54 is configured to generate a first ET voltage $V_{CCA}$ and a second ET voltage $V_{CCB}$ based on the first target voltage $V_{TGTA}$ and the second target voltage $V_{TGTB}$, respectively. Accordingly, the first power amplifier 34A is configured to amplify the first composite signal $\overrightarrow{AB}$ based on the first ET voltage $V_{CCA}$ and the second power amplifier 34B is further configured to amplify the second composite signal BA based on the second ET voltage $V_{CCB}$.

Notably, in the transceiver circuit 30 of FIG. 3, the first target voltage circuit 52A and the second target voltage circuit 52B are each generated with a respective one of the inverted first intermodulation product term $-IMD_{AB}$ and the inverted second intermodulation product term $-IMD_{BA}$. Alternatively, it is also possible to generate each of the first target voltage circuit 52A and the second target voltage circuit 52B without considering a respective one of the inverted first intermodulation product term $-IMD_{AB}$ and the inverted second intermodulation product term $-IMD_{BA}$.

Figure 4:
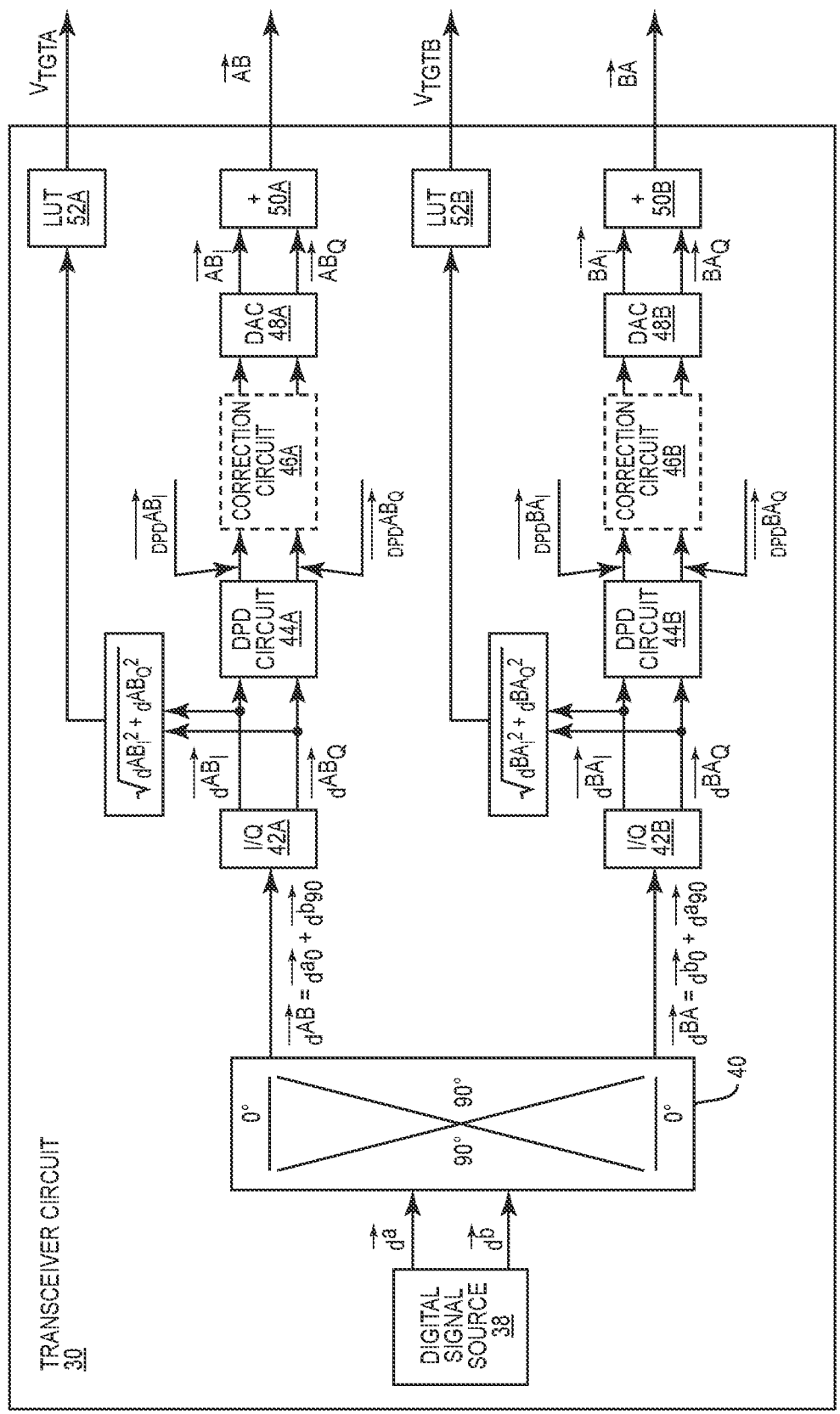
FIG. 4 is a schematic diagram providing an exemplary illustration of the transceiver circuit in FIG. 2 configured according to another embodiment of the present disclosure.

In this regard, FIG. 4 is a schematic diagram providing an exemplary illustration of the transceiver circuit 30 in FIG. 2 configured according to another embodiment of the present disclosure. Common elements between FIGS. 3 and 4 are shown therein with common element numbers and will not be re-described herein.

Herein, the first target voltage circuit 52A is configured to generate the first target voltage $V_{TGTA}$ based on amplitudes of the first digital composite in-phase signal $\overrightarrow{dAB_I}$ and the first digital composite quadrature signal $\overrightarrow{dAB_Q}$ (e.g., $\sqrt{dAB_I^2 + dAB_Q^2}$). Likewise, the second target voltage circuit 52B is configured to generate the second target voltage $V_{TGTB}$ based on amplitudes of the second digital composite in-phase signal $\overrightarrow{dBA_I}$ and the second digital composite quadrature signal $\overrightarrow{dBA_Q}$ (e.g., $\sqrt{bBA_I^2 + dBA_Q^2}$).

Those skilled in the art will recognize improvements and modifications to the preferred embodiments of the present disclosure. All such improvements and modifications are considered within the scope of the concepts disclosed herein and the claims that follow.

What is claimed is:

1. A signal processing apparatus comprising:
   a power amplifier circuit comprising:
      a first power amplifier configured to amplify a first composite signal comprising a first signal and a second signal that collectively cause a first intermodulation product term in the amplified first composite signal; and
      a second power amplifier configured to amplify a second composite signal comprising the first signal and the second signal that collectively cause a second intermodulation product term in the amplified second composite signal; and
   a transceiver circuit coupled to the power amplifier circuit and configured to:
      when a power difference between the first signal and the second signal is higher than or equal to a threshold:
         generate the first composite signal comprising an inverted first intermodulation product term to thereby offset the first intermodulation product term in the amplified first composite signal; and
         generate the second composite signal comprising an inverted second intermodulation product term to thereby offset the second intermodulation product term in the amplified second composite signal; and
      when the power difference between the first signal and the second signal is lower than the threshold:
         generate the first composite signal without the inverted first intermodulation product term; and
         generate the second composite signal without the inverted second intermodulation product term.

2. The signal processing apparatus of claim 1, wherein the transceiver circuit is further configured to determine to offset the first intermodulation product term and the second intermodulation product term independent of the power difference between the first signal and the second signal.

3. The signal processing apparatus of claim 1, wherein the first signal and the second signal in each of the first composite signal and the second composite signal have orthogonal phases.

4. The signal processing apparatus of claim 3, wherein the transceiver circuit comprises:
   a digital signal source configured to generate a first digital signal having a first phase and a second digital signal having a second phase;
   a digital hybrid circuit configured to:
      phase-shift the second digital signal to a first orthogonal phase relative to the first digital signal;
      combine the first digital signal having the first phase and the second digital signal having the first orthogonal phase to generate a first digital composite signal;
      phase-shift the first digital signal to a second orthogonal phase relative to the second digital signal; and
      combine the second digital signal having the second phase and the first digital signal having the second orthogonal phase to generate a second digital composite signal;
   a first digital circuit configured to convert the first digital composite signal into a first digital composite in-phase signal and a first digital composite quadrature signal each comprising the first digital signal in the first phase and the second digital signal in the first orthogonal phase; and a second digital circuit configured to convert the second digital composite signal into a second digital composite in-phase signal and a second digital composite quadrature signal each comprising the second digital signal in the second phase and the first digital signal in the second orthogonal phase.

5. The signal processing apparatus of claim 4, wherein the transceiver circuit further comprises:
a first digital pre-distortion (DPD) circuit configured to add the inverted first intermodulation product term in each of the first digital composite in-phase signal and the first digital composite quadrature signal to generate a respective one of a pre-distorted first digital composite in-phase signal and a pre-distorted first digital composite quadrature signal; and
a second DPD circuit configured to add the inverted second intermodulation product term in each of the second digital composite in-phase signal and the second digital composite quadrature signal to generate a respective one of a pre-distorted second digital composite in-phase signal and a pre-distorted second digital composite quadrature signal.

6. The signal processing apparatus of claim 5, wherein the transceiver circuit further comprises:
a first correction circuit configured to phase-shift one or more of the pre-distorted first digital composite in-phase signal and the pre-distorted first digital composite quadrature signal; and
a second correction circuit configured to phase-shift one or more of the pre-distorted second digital composite in-phase signal and the pre-distorted second digital composite quadrature signal.

7. The signal processing apparatus of claim 6 wherein:
the first correction circuit is further configured to amplitude-adjust one or more of the pre-distorted first digital composite in-phase signal and the pre-distorted first digital composite quadrature signal; and
the second correction circuit is further configured to amplitude-adjust one or more of the pre-distorted second digital composite in-phase signal and the pre-distorted second digital composite quadrature signal.

8. The signal processing apparatus of claim 5, wherein the transceiver circuit further comprises:
a first digital-to-analog converter (DAC) configured to:
convert the pre-distorted first digital composite in-phase signal into a first analog composite in-phase signal comprising the first signal in the first phase and the second signal in the first orthogonal phase; and
convert the pre-distorted first digital composite quadrature signal into a first analog composite quadrature signal comprising the first signal in the first phase and the second signal in the first orthogonal phase; and
a second DAC configured to:
convert the pre-distorted second digital composite in-phase signal into a second analog composite in-phase signal comprising the second signal in the second phase and the first signal in the second orthogonal phase; and
convert the pre-distorted second digital composite quadrature signal into a second analog composite quadrature signal comprising the second signal in the second phase and the first signal in the second orthogonal phase.

9. The signal processing apparatus of claim 8, wherein the transceiver circuit further comprises:
a first combiner circuit configured to combine the first analog composite in-phase signal and the first analog composite quadrature signal to generate the first composite signal comprising the first signal in the first phase and the second signal in the first orthogonal phase; and
a second combiner circuit configured to combine the second analog composite in-phase signal and the second analog composite quadrature signal to generate the second composite signal comprising the second signal in the second phase and the first signal in the second orthogonal phase.

10. The signal processing apparatus of claim 5, wherein the transceiver circuit further comprises:
a first target voltage circuit configured to generate a first target voltage based on amplitudes of the pre-distorted first digital composite in-phase signal and the pre-distorted first digital composite quadrature signal; and
a second target voltage circuit configured to generate a second target voltage based on amplitudes of the pre-distorted second digital composite in-phase signal and the pre-distorted second digital composite quadrature signal.

11. The signal processing apparatus of claim 10, further comprising an envelope tracking (ET) integrated circuit (ETIC) configured to generate a first ET voltage and a second ET voltage based on the first target voltage and the second target voltage, respectively, wherein:
the first power amplifier is further configured to amplify the first composite signal based on the first ET voltage; and
the second power amplifier is further configured to amplify the second composite signal based on the second ET voltage.

12. The signal processing apparatus of claim 4, wherein the transceiver circuit further comprises:
a first target voltage circuit configured to generate a first target voltage based on amplitudes of the first digital composite in-phase signal and the first digital composite quadrature signal; and
a second target voltage circuit configured to generate a second target voltage based on amplitudes of the second digital composite in-phase signal and the second digital composite quadrature signal.

13. The signal processing apparatus of claim 1, wherein the power amplifier circuit further comprises an analog hybrid circuit configured to regenerate the first signal and the second signal based on the first composite signal and the second composite signal.

14. A transceiver circuit comprising:
a first digital pre-distortion (DPD) circuit coupled to a first power amplifier configured to amplify a first composite signal comprising a first signal and a second signal that collectively cause a first intermodulation product term in the amplified first composite signal, the first DPD circuit is configured to:
cause an inverted first intermodulation product term to be added in the first composite signal to thereby offset the first intermodulation product term when a power difference between the first signal and the second signal is higher than or equal to a threshold; and
not cause the inverted first intermodulation product term to be added in the first composite signal when the power difference between the first signal and the second signal is lower than the threshold; and a second DPD circuit coupled to a second power amplifier configured to amplify a second composite signal comprising the first signal and the second signal that collectively cause a second intermodulation product term in the amplified second composite signal, the second DPD circuit is configured to:
  cause an inverted second intermodulation product term to be added in the second composite signal to thereby offset the second intermodulation product term when the power difference between the first signal and the second signal is higher than or equal to the threshold; and
  not cause the inverted first intermodulation product term to be added in the second composite signal when the power difference between the first signal and the second signal is lower than the threshold.

15. The transceiver circuit of claim 14, further comprising:
  a digital signal source configured to generate a first digital signal having a first phase and a second digital signal having a second phase;
  a digital hybrid circuit configured to:
    phase-shift the second digital signal to a first orthogonal phase relative to the first digital signal;
    combine the first digital signal having the first phase and the second digital signal having the first orthogonal phase to generate a first digital composite signal;
    phase-shift the first digital signal to a second orthogonal phase relative to the second digital signal; and
    combine the second digital signal having the second phase and the first digital signal having the second orthogonal phase to generate a second digital composite signal;
  a first digital circuit configured to convert the first digital composite signal into a first digital composite in-phase signal and a first digital composite quadrature signal each comprising the first digital signal in the first phase and the second digital signal in the first orthogonal phase; and
  a second digital circuit configured to convert the second digital composite signal into a second digital composite in-phase signal and a second digital composite quadrature signal each comprising the second digital signal in the second phase and the first digital signal in the second orthogonal phase.

16. The transceiver circuit of claim 15, wherein when the power difference between the first signal and the second signal is higher than or equal to the threshold:
  the first DPD circuit is further configured to add the inverted first intermodulation product term in each of the first digital composite in-phase signal and the first digital composite quadrature signal to generate a respective one of a pre-distorted first digital composite in-phase signal and a pre-distorted first digital composite quadrature signal; and
  the second DPD circuit is further configured to add the inverted second intermodulation product term in each of the second digital composite in-phase signal and the second digital composite quadrature signal to generate a respective one of a pre-distorted second digital composite in-phase signal and a pre-distorted second digital composite quadrature signal.

17. The transceiver circuit of claim 16, further comprising:
  a first digital-to-analog converter (DAC) configured to:
    convert the pre-distorted first digital composite in-phase signal into a first analog composite in-phase signal comprising the first signal in the first phase and the second signal in the first orthogonal phase; and
    convert the pre-distorted first digital composite quadrature signal into a first analog composite quadrature signal comprising the first signal in the first phase and the second signal in the first orthogonal phase; and
  a second DAC configured to:
    convert the pre-distorted second digital composite in-phase signal into a second analog composite in-phase signal comprising the second signal in the second phase and the first signal in the second orthogonal phase; and
    convert the pre-distorted second digital composite quadrature signal into a second analog composite quadrature signal comprising the second signal in the second phase and the first signal in the second orthogonal phase.

18. The transceiver circuit of claim 17, further comprising:
  a first combiner circuit configured to combine the first analog composite in-phase signal and the first analog composite quadrature signal to generate the first composite signal comprising the first signal in the first phase and the second signal in the first orthogonal phase; and
  a second combiner circuit configured to combine the second analog composite in-phase signal and the second analog composite quadrature signal to generate the second composite signal comprising the second signal in the second phase and the first signal in the second orthogonal phase.

* * * * *

UNITED STATES PATENT AND TRADEMARK OFFICE
CERTIFICATE OF CORRECTION

PATENT NO. : 12,424,988 B2
APPLICATION NO. : 18/039910
DATED : September 23, 2025
INVENTOR(S) : Nadim Khlat Page 1 of 1

It is certified that error appears in the above-identified patent and that said Letters Patent is hereby corrected as shown below:

In the Specification

In Column 1, at Line 37, replace "a capable" with --a 5G-NR capable--

In Column 4, at Line 31, replace "6" with -- $\vec{b}$ --

In Column 6, at Line 21, replace "first signal a" with --first signal $\vec{a}$--

In Column 6, at Line 22, replace "signal 6" with --signal $\vec{b}$--

In Column 9, at Line 1, replace "AB" with --$\vec{AB}$--

In Column 9, at Line 2, replace "BA" with --$\vec{BA}$--

In Column 9, at Line 20, replace "BA" with --$\vec{BA}$--

In Column 10, at Line 62, replace "BA" with --$\vec{BA}$--

In Column 11, at Line 32, replace "BA" with --$\vec{BA}$--

Signed and Sealed this
Eleventh Day of November, 2025

John A. Squires
*Director of the United States Patent and Trademark Office*